US010950565B2

(12) United States Patent
Mayer et al.

(10) Patent No.: US 10,950,565 B2
(45) **Date of Patent: *Mar. 16, 2021**

(54) INTERCONNECT STRUCTURES FOR PREVENTING SOLDER BRIDGING, AND ASSOCIATED SYSTEMS AND METHODS

(71) Applicant: Micron Technology, Inc., Boise, ID (US)

(72) Inventors: Kyle S. Mayer, Nampa, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/810,768

(22) Filed: Mar. 5, 2020

(65) Prior Publication Data

US 2020/0203297 A1 Jun. 25, 2020

Related U.S. Application Data

(63) Continuation of application No. 16/182,924, filed on Nov. 7, 2018, now Pat. No. 10,600,750, which is a (Continued)

(51) Int. Cl.
*H01L 23/00* (2006.01)
*H01L 21/288* (2006.01)

(52) U.S. Cl.
CPC ............ *H01L 24/05* (2013.01); *H01L 21/288* (2013.01); *H01L 21/2885* (2013.01); (Continued)

(58) Field of Classification Search
CPC ........................................................ H01L 24/05
See application file for complete search history.

(56) References Cited

U.S. PATENT DOCUMENTS 9,136,211 B2 9/2015 Wang et al.
9,269,732 B2 2/2016 Tsai
(Continued)

FOREIGN PATENT DOCUMENTS

KR 20170042119 A 4/2017
TW 201436139 A 9/2014

OTHER PUBLICATIONS

International Application No. PCT/US2018/056350—International Search Report and Written Opinion, dated Feb. 13, 2019, 14 pages.
(Continued)

*Primary Examiner* — William Coleman
(74) *Attorney, Agent, or Firm* — Perkins Coie LLP

(57) ABSTRACT

Semiconductor dies having interconnect structures formed thereon, and associated systems and methods, are disclosed herein. In one embodiment, an interconnect structure includes a conductive material electrically coupled to an electrically conductive contact of a semiconductor die. The conductive material includes a first portion vertically aligned with the conductive contact, and a second portion that extends laterally away from the conductive contact. A solder material is disposed on the second portion of the interconnect structure such that the solder material is at least partially laterally offset from the conductive contact of the semiconductor die. In some embodiments, an interconnect structure can further include a containment layer that prevents wicking or other undesirable movement of the solder material during a reflow process.

20 Claims, 9 Drawing Sheets

Related U.S. Application Data continuation of application No. 15/853,512, filed on Dec. 22, 2017, now Pat. No. 10,297,561.

(52) U.S. Cl.
CPC .............. *H01L 24/03* (2013.01); *H01L 24/11* (2013.01); *H01L 24/13* (2013.01); *H01L 2224/0219* (2013.01); *H01L 2224/0239* (2013.01); *H01L 2224/02175* (2013.01); *H01L 2224/02311* (2013.01); *H01L 2224/02331* (2013.01); *H01L 2224/02375* (2013.01); *H01L 2224/03013* (2013.01); *H01L 2224/0345* (2013.01); *H01L 2224/0347* (2013.01); *H01L 2224/03462* (2013.01); *H01L 2224/03464* (2013.01); *H01L 2224/03826* (2013.01); *H01L 2224/0401* (2013.01); *H01L 2224/05008* (2013.01); *H01L 2224/05547* (2013.01); *H01L 2224/05548* (2013.01); *H01L 2224/05565* (2013.01); *H01L 2224/05582* (2013.01); *H01L 2224/1132* (2013.01); *H01L 2224/1146* (2013.01); *H01L 2224/1147* (2013.01); *H01L 2224/11334* (2013.01); *H01L 2224/11474* (2013.01); *H01L 2224/11826* (2013.01); *H01L 2224/11849* (2013.01); *H01L 2224/13007* (2013.01); *H01L 2224/13024* (2013.01); *H01L 2224/13027* (2013.01); *H01L 2924/01028* (2013.01); *H01L 2924/01029* (2013.01)

(56) References Cited

U.S. PATENT DOCUMENTS

| | | | |
|---|---|---|---|
| 9,659,891 | B2 | 5/2017 | Hwang et al. |
| 9,960,125 | B2 | 5/2018 | Lin et al. |
| 10,297,561 | B1 * | 5/2019 | Mayer ..................... H01L 24/03 |
| 10,600,750 | B2 * | 3/2020 | Mayer ................. H01L 21/2885 |
| 2008/0157338 | A1 | 7/2008 | Nakasato et al. |
| 2008/0217769 | A1 | 9/2008 | Yanase et al. |
| 2009/0278263 | A1 | 11/2009 | McCarthy et al. |
| 2012/0241970 | A1 | 9/2012 | Ohnishi et al. |
| 2014/0077367 | A1 | 3/2014 | Arvin et al. |
| 2014/0203428 | A1 | 7/2014 | Colgan et al. |
| 2014/0252593 | A1 | 9/2014 | Chen |
| 2016/0240500 | A1 | 8/2016 | Huang |
| 2017/0256513 | A1 | 9/2017 | Hwang et al. |
| 2019/0198470 | A1 | 6/2019 | Mayer et al. |

OTHER PUBLICATIONS

TW Patent Application No. 107138724—Taiwanese Office Action and Search Report, dated Nov. 29, 2019, with English Translation, 23 pages.

* cited by examiner

INTERCONNECT STRUCTURES FOR PREVENTING SOLDER BRIDGING, AND ASSOCIATED SYSTEMS AND METHODS

CROSS-REFERENCE TO RELATED APPLICATIONS

This application is a continuation of U.S. patent application Ser. No. 16/182,924, filed Nov. 7, 2018; which is a continuation of U.S. patent application Ser. No. 15/853,512, filed Dec. 22, 2017, now U.S. Pat. No. 10,297,561; each of which is incorporated herein by reference in its entirety.

TECHNICAL FIELD

The preset technology is directed generally to semiconductor devices, and in several embodiments more particularly to interconnect structures for die-to-die and/or package-to-package interconnects.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting encapsulated assemblies. To meet these demands, semiconductor die manufacturers often stack multiple semiconductor dies vertically on top of each other to increase the capacity or performance of a microelectronic device within the limited volume on the circuit board or other element to which the semiconductor dies are mounted.

The stacked semiconductor dies are typically electrically connected by solder bumps that are attached to metal pillars formed on bond pads of the dies. Often, the bond pads of each semiconductor die are spaced closely together such that when solder is reflowed during the stacking process to form the solder bumps, the solder can sometimes "bridge" between adjacent metal pillars to electrically connect adjacent ones of the pillars and short the semiconductor device. Conventional methods for inhibiting solder bridging include relaxing the pillar pitch by forming a redistribution layer (RDL) on the semiconductor dies to redistribute the electrical connections to the bond pads. Alternatively, the semiconductor dies can be re-designed such that the bonds pads of each die have a greater pitch. However, both of these methods can increase the cost and/or complexity of designing and manufacturing a semiconductor device.

DETAILED DESCRIPTION

Figure 1A:
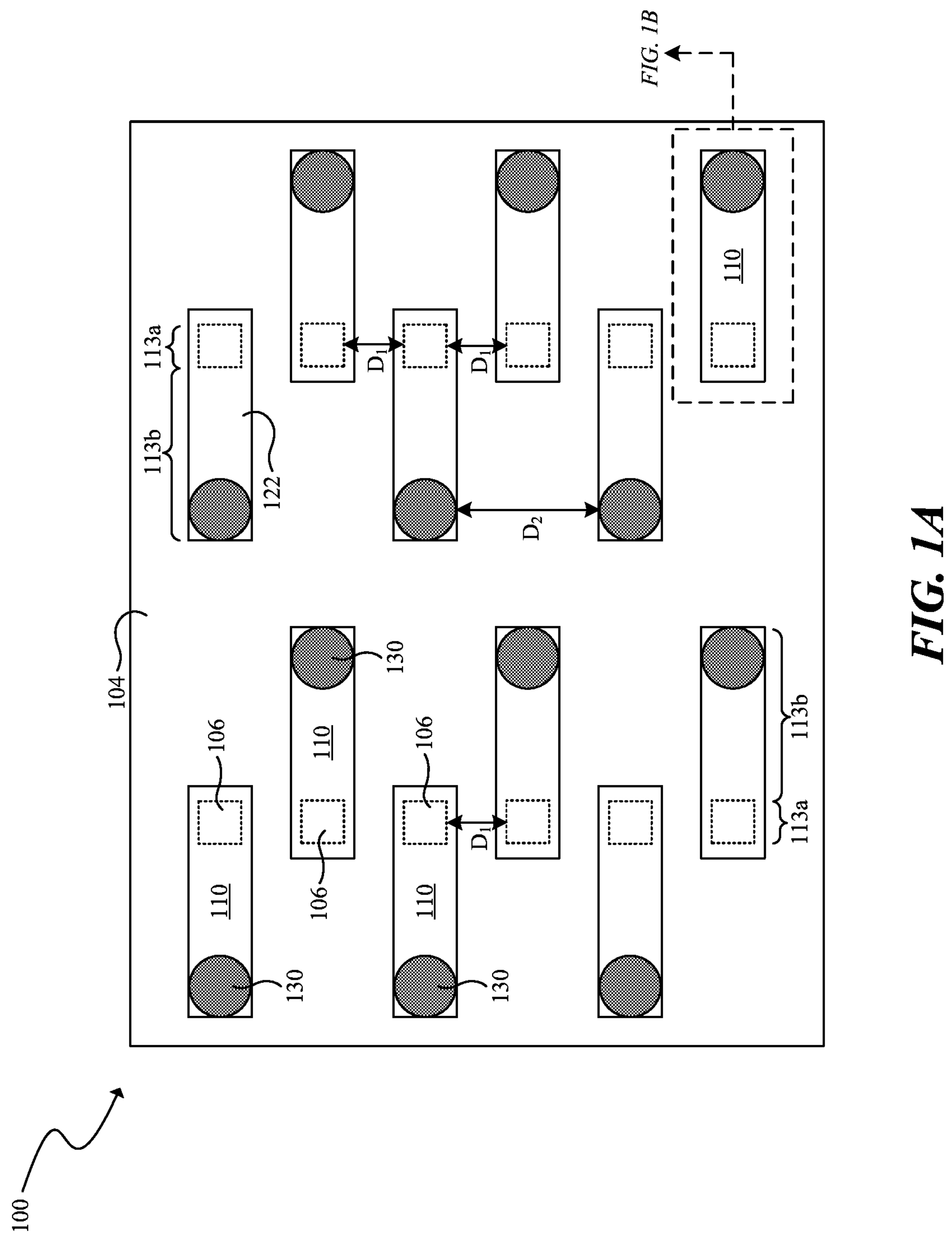
FIG. 1A is a top plan view of a semiconductor die having interconnect structures configured in accordance with an embodiment of the present technology.

Specific details of several embodiments of semiconductor devices are described below along with related systems and methods. Examples of semiconductor devices include logic devices, memory devices, microprocessors, and diodes among others. The term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

In several of the embodiments described below, a semiconductor die includes a semiconductor substrate having at least a first contact and a second contact (e.g., bond pads or portions of vias that extend through the substrate) exposed at a surface of the semiconductor substrate. A first interconnect structure is electrically coupled to the first contact, and a second interconnect structure is electrically coupled to the second contact. The first interconnect structure can include a top surface having a first portion over the first contact and a second portion laterally offset from the first contact. A solder material can be disposed on the second portion of the top surface such that the solder material is at least partially laterally offset from the first contact. Similarly, the second interconnect structure can include a top surface having a third portion over the second contact and a fourth portion laterally offset from the second contact, and a solder material can be disposed on the fourth portion of the top surface such that the solder material is at least partially offset from the second contact.

In certain embodiments, the distance between the solder material on the first and second interconnect structures is greater than the distance between the first and second contacts. Accordingly, as compared to conventional interconnect structures in which the solder material is vertically aligned with the contacts of the semiconductor die, the interconnect structures of the present technology can reduce the likelihood of solder material bridging between the first and second interconnects during reflow of the solder material. This is expected to increase yield by reducing the occurrence of solder bridging—and therefore electrical shorting—of manufactured semiconductor devices.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

Figure 1B:
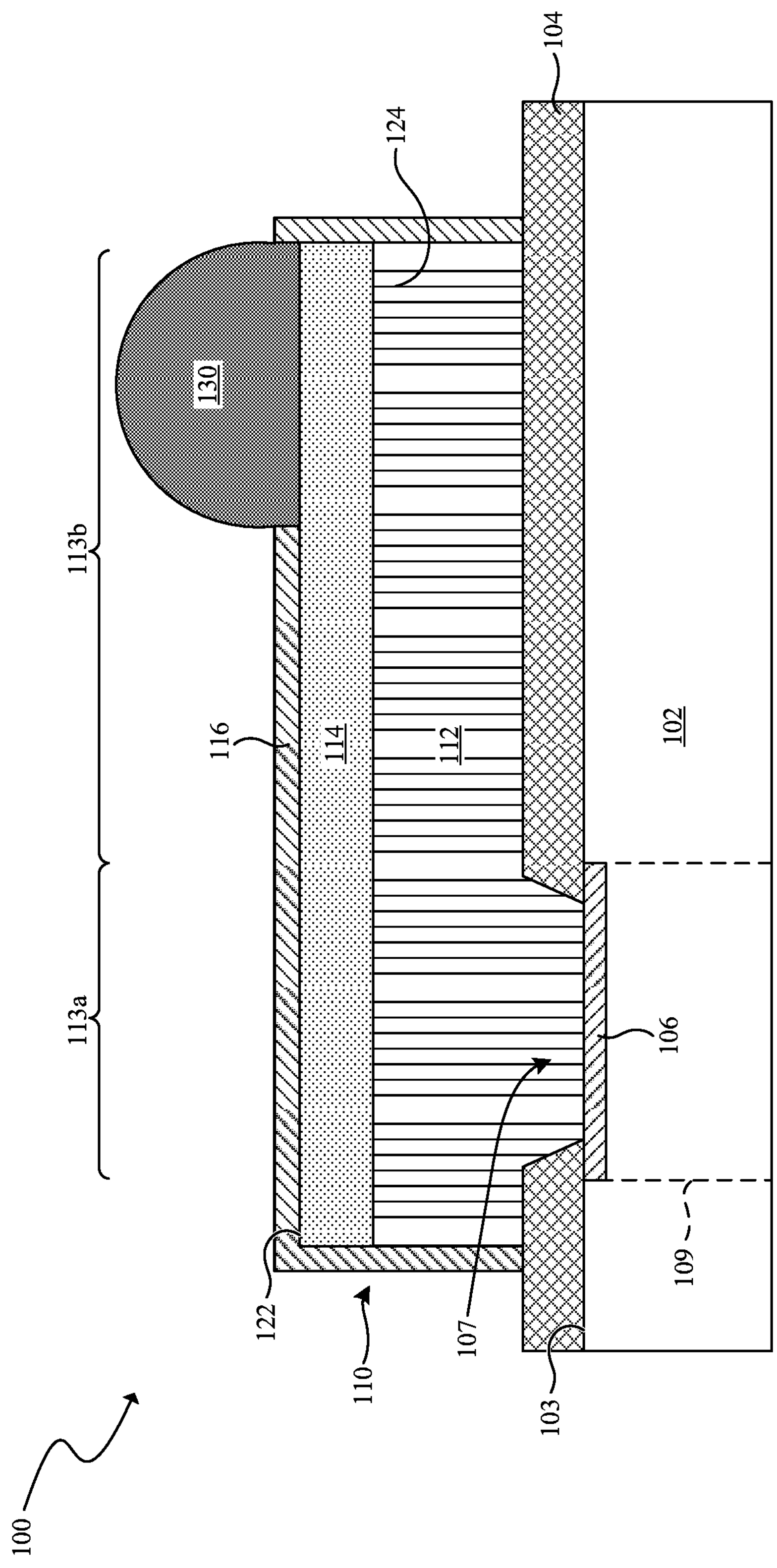
FIG. 1B is an enlarged cross-sectional view of the semiconductor die of FIG. 1A showing an individual interconnect structure in accordance with an embodiment of the present technology.

FIG. 1A is a top plan view of a semiconductor die 100 having interconnect structures 110 configured in accordance with embodiments of the present technology. FIG. 1B is an enlarged cross-sectional view of a portion of the semiconductor die 100 of FIG. 1A showing an individual interconnect structure 110 configured in accordance with embodiments of the present technology. Referring to FIGS. 1A and 1B together, the semiconductor die 100 includes a substrate 102 (e.g., a semiconductor substrate) having an upper surface 103 and an insulating material 104 at least partially over the upper surface 103. The insulating material 104 can be, for example, a suitable dielectric material (e.g., a passivation material, a polyimide material, and/or other materials used to cover a top surface of a semiconductor device). The semiconductor die 100 further includes electrically conductive contacts 106 (shown in phantom in FIG. 1A) at the upper surface 103 of the substrate 102 and at least partially exposed from the insulating material 104 through openings 107 in the insulating material 104. The interconnect structures 110 are electrically coupled to corresponding contacts 106, and an electrical connector 130 (e.g., a solder ball, a micro bump, etc.) can be disposed on each of the interconnect structures 110.

In general, the contacts 106 are electrically coupled to integrated circuitry of the substrate 102. The integrated circuitry can include, for example, a memory circuit (e.g., a dynamic random memory (DRAM)), a controller circuit (e.g., a DRAM controller), a logic circuit, and/or other circuits or combinations of circuits. In some embodiments, the contacts 106 are bond pads while, in other embodiments, the contacts 106 can be a portion of a via (e.g., a through-silicon via (TSV)) that extends partially or completely through the substrate 102. For example, as shown in FIG. 1B, the contacts 106 can be upper portions of TSVs 109 (shown in phantom in FIG. 1B) that extend completely through the substrate 102. In some embodiments, the TSVs 109 include a dielectric liner and a conductive plug within the dielectric liner.

In the embodiment illustrated in FIG. 1A, the substrate 102 has a generally rectangular shape while, in other embodiments, the substrate 102 can have any other shape such as circular, square, polygonal, etc. As shown, the contacts 106 can each have a rectilinear (e.g., square) shape and can be arranged in two columns along the upper surface 103 of the substrate 102. However, in other embodiments, the contacts 106 can have any other shape, configuration, or number. For example, the contacts 106 can be circular, polygonal, etc., and may be arranged in multiple rows and/or columns positioned along the upper surface 103. Likewise, each row and/or column can have more or fewer than the illustrated six contacts 106. Moreover, as shown in FIG. 1A, each of the contacts 106 are equally spaced from adjacent ones of the contacts 106 in the same column by a distance $D_1$. In certain embodiments, the distance between adjacent contacts 106 can vary.

Referring to FIG. 1B, the interconnect structures 110 each include a first conductive material 112 and a second conductive material 114 disposed over the first conductive material 112. The first conductive material 112 is positioned over at least a portion of a corresponding contact 106 to electrically couple the interconnect structure 110 to the contact 106. The first conductive material 112 extends laterally outward from the contact 106 over the insulating material 104 (e.g., to the right of the page in the embodiment illustrated in FIG. 1B). The second conductive material 114 defines a top surface 122 of the interconnect structure 110, and the first and second conductive materials 112 and 114 (collectively "conductive materials 112, 114") jointly define a sidewall surface 124 of the interconnect structure 110 that extends between the top surface 122 and the insulating material 104 and the contact 106. More particularly, as shown in both FIGS. 1A and 1B, the top surfaces 122 of the interconnect structures 110 can each have a first portion **113*a* that is vertically aligned with (e.g., overlapping) a corresponding contact 106, and a second portion 113*b* that is laterally offset from the contact 106 and therefore not vertically aligned with the contact 106**.

In the embodiments illustrated in FIGS. 1A and 1B, the interconnect structures 110 have an elongate, generally rectilinear, shape. However, the shape and dimensions of the interconnect structures 110 can vary. For example, in some embodiments the interconnect structures 110 can have other cross-sectional shapes such as, rectangular, regular polygonal, irregular polygonal, elliptical, etc. Furthermore, in some embodiments, the interconnect structures 110 can have a height of between about 100 nanometers-100 microns (e.g., about 4-50 microns). In certain embodiments, the interconnect structures 110 can extend laterally away from the contacts 106 a distance of between about 1-3000 microns (e.g., about 100 microns, about 150 microns, about 200 microns, etc.). That is, the second portion **113*b* of the top surface 122 of the interconnect structures 110 can have a length of between about 1-3000 microns. In some embodiments, the interconnect structures 110 can extend laterally to proximate an edge of the semiconductor die 100. In a particular embodiment, the first conductive material 112 comprises copper and the second conductive material 114 comprises nickel. In other embodiments, the conductive materials 112, 114 can comprise any electrically conductive materials such as, for example, gold, silicon, tungsten, etc. In yet other embodiments, the interconnect structures 110** can include only a single conductive material, or more than two layers of the same or different conductive materials.

The electrical connectors 130 are disposed at least partially on the second portions **113*b* such that the electrical connectors 130 are at least partially laterally offset from the contacts 106. As shown in FIGS. 1A and 1B, the electrical connectors 130 can be disposed entirely within the second portions 113*b* of the top surfaces 122 such that none of the electrical connectors 130 are vertically aligned with the contacts 106. In other embodiments, one or more of the electrical connectors 130 can be disposed partially within (e.g., straddle) the first and second portions 113*a* and 113*b*. Accordingly, in some embodiments, a portion (e.g., less than about 25%, less than about 50%, less than about 75%, etc.) of one or more of the electrical connectors 130 can be vertically aligned with (e.g., overlap) a corresponding contact 106. In some embodiments, multiple electrical connectors 130 can be disposed on the same interconnect structure 110. The electrical connectors 130 can comprise a solder material such as, for example, tin-silver, indium, or another suitable solder material for forming an electrical and mechanical connection between the interconnect structures 110** and an adjacent semiconductor die or other electrical device (e.g., a substrate, a semiconductor package, etc.).

Referring again to FIG. 1B, each interconnect structure 110 can further include a containment layer 116 at least partially over the first portion 113*a* of the top surface 122. In some embodiments, as shown in FIG. 1B, the containment layer 116 can be formed over all or substantially all of the exposed portions of the conductive materials 112, 114. More particularly, in certain embodiments, the containment layer 116 can be formed over all of the sidewall surface 124 of the interconnect structure 110, over the entire first portion 113*a* of the top surface 122, and partially over the second portion 113*b* of the top surface 122 where the electrical connector 130 does not contact the second conductive material 114. In other embodiments, the containment layer 116 can be formed over more or less of the top and sidewall surfaces 122 and 124. For example, in some embodiments, the containment layer 116 is not formed over the sidewall surface 122 of the interconnect structure 110.

In general, the containment layer 116 is configured to confine the electrical connector 130 (e.g., a solder material) and inhibit wicking of the electrical connector 130 onto undesired surfaces of the interconnect structure 110 during, for example, a reflow process. Such wicking may deleteriously affect an electrical and/or mechanical connection between the interconnect structure 110 and, for example, another semiconductor die by degrading the overall electrical conductivity and mechanical strength of the joint formed by the electrical connector 130. As shown in FIG. 1B, the containment layer 116 can inhibit wicking of the electrical connector 130 (*i*) from the second portion 113*b* onto and/or toward the first portion 113*a* of the top surface 122 and (ii) from the second portion 113*b* onto and/or toward the sidewall surface 124. In some embodiments, the containment layer 116 comprises an anti-wetting material that prevents wetting of the electrical connector 130 onto the surfaces of the conductive materials 112, 114 that it covers. That is, the anti-wetting material of the containment layer 116 can provide a non-wettable surface for the electrical connector 130. For example, the anti-wetting material of the containment layer 116 can have a diffusability for the electrical connector 130 that is extremely low or negligible. In some embodiments, the containment layer 116 comprises an oxide, a nitride, or polyimide. In a particular embodiment, the containment layer 116 comprises nickel oxide. In certain embodiments, the containment layer 116 has a thickness of between about 100-5000 Å, or in some embodiments between about 2000-2500 Å. In certain embodiments where the containment layer 116 comprises polyimide, the containment layer 116 can have a thickness of between about 1-10 microns (e.g., about 5 microns).

Referring to the top plan view of FIG. 1A, in some embodiments, adjacent interconnect structures 110 (e.g., interconnect structures 110 electrically coupled to adjacent ones of the contacts 106 in the same column) can extend laterally along the insulating material 104 in different directions to increase the spacing (e.g., pitch) between the electrical connectors 130. For example, as shown, the electrical connectors 130 can be separated by a distance $D_2$ that is greater than the distance $D_1$ between adjacent contacts 106. In certain embodiments, the distance $D_2$ is at least twice the first distance $D_1$. In contrast, conventional interconnect structures extend vertically above contacts of a semiconductor die such that the solder on each interconnect structure is vertically aligned with the contacts. Accordingly, in such conventional devices, the spacing between solder joints is approximately equal to the spacing between the contacts (e.g., the distance $D_1$). The interconnect structures 110 described herein advantageously increase the spacing between solder joints to reduce the likelihood of solder material bridging between any of the interconnect structures 110 during a reflow process, and thereby forming an electrical connection that shorts the semiconductor die 100. Accordingly, the present technology can increase the yield of a semiconductor device manufacturing process by reducing defects due to solder bridging.

FIGS. 2A-2G are enlarged cross-sectional views illustrating various stages in a method of manufacturing a semiconductor die 100 having interconnect structures 110 thereon, in accordance with embodiments of the present technology. For ease of explanation and understanding, FIGS. 2A-2G illustrate the fabrication of a single interconnect structure 110 of the semiconductor die 100. However, the stages illustrated with respect to FIGS. 2A-2G can be repeated and/or extended to form each of the interconnect structures 110 of the semiconductor die 100. Moreover, in general, the semiconductor die 100 can be manufactured, for example, as a discrete device or as part of a larger wafer or panel. In wafer-level or panel-level manufacturing, a larger semiconductor device is formed before being singulated to form a plurality of individual semiconductor dies. One skilled in the art will readily understand that the fabrication of the semiconductor die 100 can be scaled to the wafer and/or panel level—that is, to include many more components so as to be capable of being singulated into more than one semiconductor die 100—while including similar features and using similar processes as described herein.

Figure 2A:
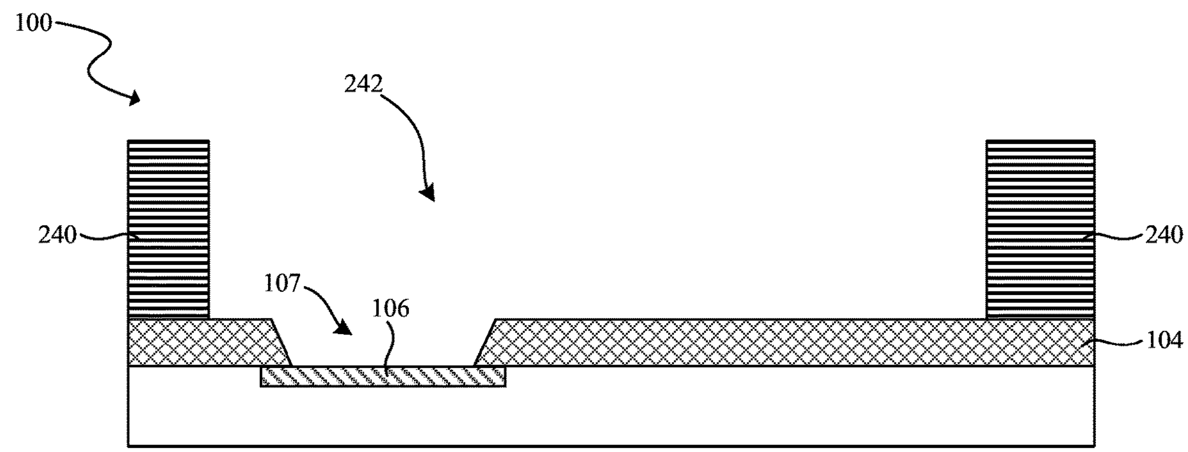
FIGS. 2A-2G are enlarged cross-sectional views illustrating a semiconductor die at various stages in a method for making interconnect structures in accordance with embodiments of the present technology.

Referring to FIG. 2A, at this stage of the method a first mask 240 (e.g., a photomask) is formed on the insulating material 104. The first mask 240 can be a resist material or other suitable mask material having an opening 242 at least partially aligned with (i) the opening 107 in the insulating material 104, (ii) the contact 106, and (iii) a portion of the insulating 104 extending laterally, adjacent to the contact 106. As explained in more detail below, the conductive portions of the interconnect structure 110 are formed in the opening 242 of the first mask 240. In the embodiment illustrated in FIG. 2A, the opening 242 of the first mask 240 has a generally rectangular cross-sectional shape. However, masks having other cross-sectional shapes may be used to form an interconnect structure having a different shape.

In some embodiments, the semiconductor die 100 further has a seed structure (not pictured) formed on the insulating material 104 and the portion of the contact 106 exposed at the opening 107 of the insulating material 104. The seed structure can be a single material suitable for plating the base or first material of an interconnect structure. In some embodiments, a seed structure can include a barrier material and a seed material on the barrier material. The barrier material can be tantalum, tantalum nitride, titanium, titanium-tungsten or another material that prevents diffusion of the interconnect structure materials into the insulating material 104 and the substrate 102. The seed material can be copper, a copper alloy, nickel, or other suitable materials for plating the first conductive material 112 (FIG. 1B) onto the seed material using electro-plating or electroless-plating techniques known in the art. For example, in some embodiments, a seed structure can include a copper seed material deposited using a physical vapor deposition process.

Figure 2B:
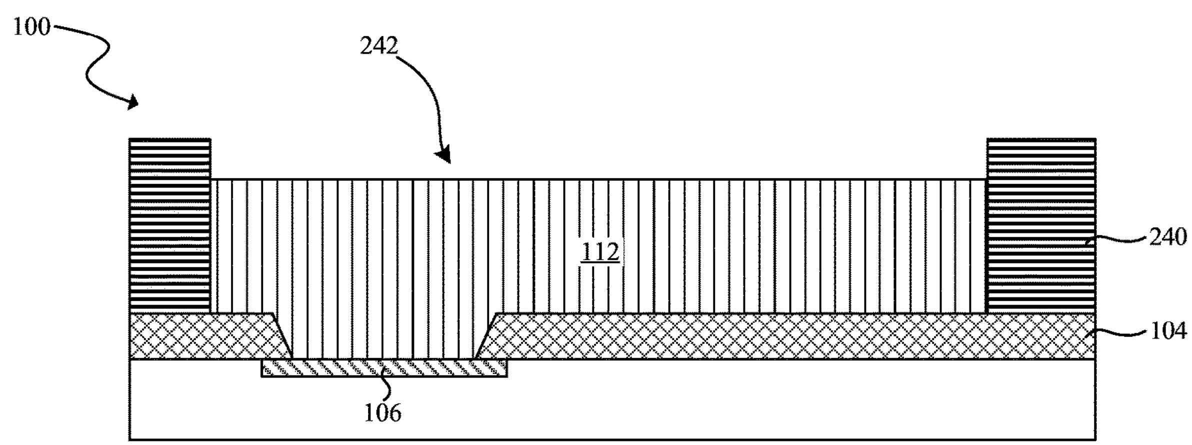

FIG. 2B illustrates the semiconductor die 100 after forming the first conductive material 112 in the opening 242 of the first mask 240 and over the contact 106 and the insulating material 104. The first conductive material 112 can be formed in the opening 242 using an electro-plating or electroless-plating process known in the art. In certain embodiments, the first conductive material 112 comprises copper.

Figure 2C:
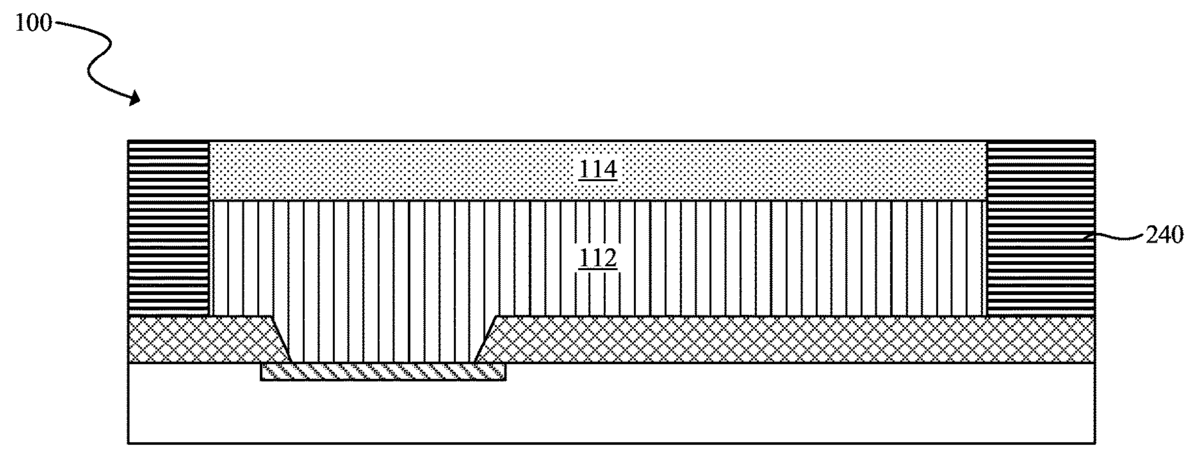

Referring to FIG. 2C, fabrication of the semiconductor die 100 continues by forming the second conductive material 114 in the opening 242 (FIG. 2B) of the first mask 240 and over the first conductive material 112. The second conductive material 114 can be formed in the same or a similar manner as the first conductive material 112, and can comprise nickel or other suitable materials. In some embodiments, the second conductive material 114 can be selected to provide a good wetting surface for forming electrical connectors on the second conductive material 114.

Figure 2D:
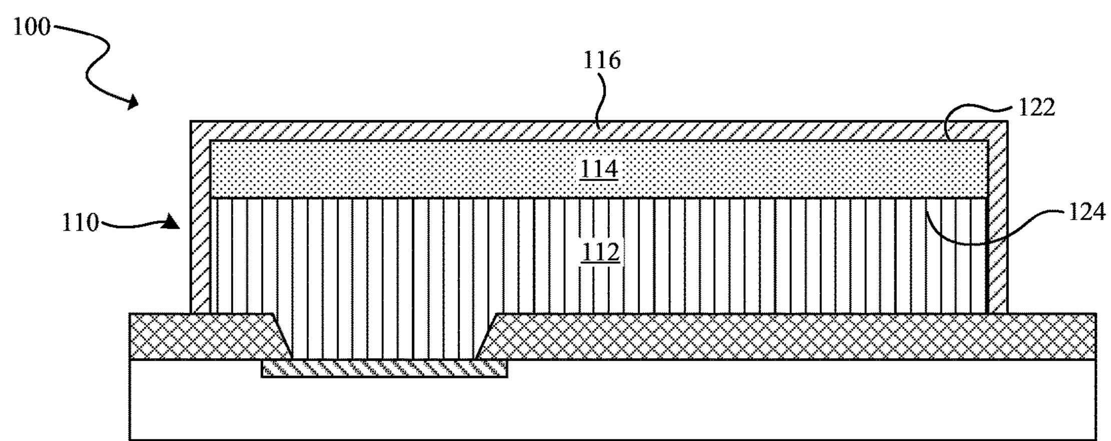

FIG. 2D illustrates the semiconductor die 100 after removing the first mask 240 and after forming the containment layer 116 over the top surface 122 and sidewall surface 124 of the interconnect structure 110. The first mask 240 can be removed using a wet photoresist strip or other suitable technique known in the art. In the embodiment illustrated in FIG. 2D, the containment layer 116 is formed as a blanket layer over all of the exposed surfaces of the conductive materials 112, 114, including covering the entire top surface 122. As described above, the containment layer can be a material (i) to which a solder material of the electrical connector 130 (FIG. 1B) does not readily wet (e.g., cover) in a liquid phase and/or (ii) that has a low or negligible diffusability for the solder material of the electrical connector 130.

In some embodiments, the containment layer 116 is formed by exposing the conductive materials 112, 114 to a plasma (e.g., using a plasma-enhanced chemical vapor deposition or other suitable process). For example, in some embodiments the plasma is an $O_2$ plasma and the second conductive material 114 is nickel. Accordingly, the containment layer 116 can at least partially comprise nickel oxide (e.g., at the top surface 122 of the interconnect structure 110 where the 02 plasma reacts with the second conductive material 114). In certain embodiments, the first mask 240 is not removed prior to formation of the containment layer 116. In such embodiments, the containment layer 116 can be formed on only the top surface 122 of the interconnect structure 110, and not the sidewall surface 124. In other embodiments, the containment layer 116 can be selectively formed on only a portion of the top surface 122 and/or the sidewall surface 124. In yet other embodiments, as described below with reference to FIGS. 3A-3D, the electrical connector 130 can be formed before forming the containment layer 116.

Figure 2E:
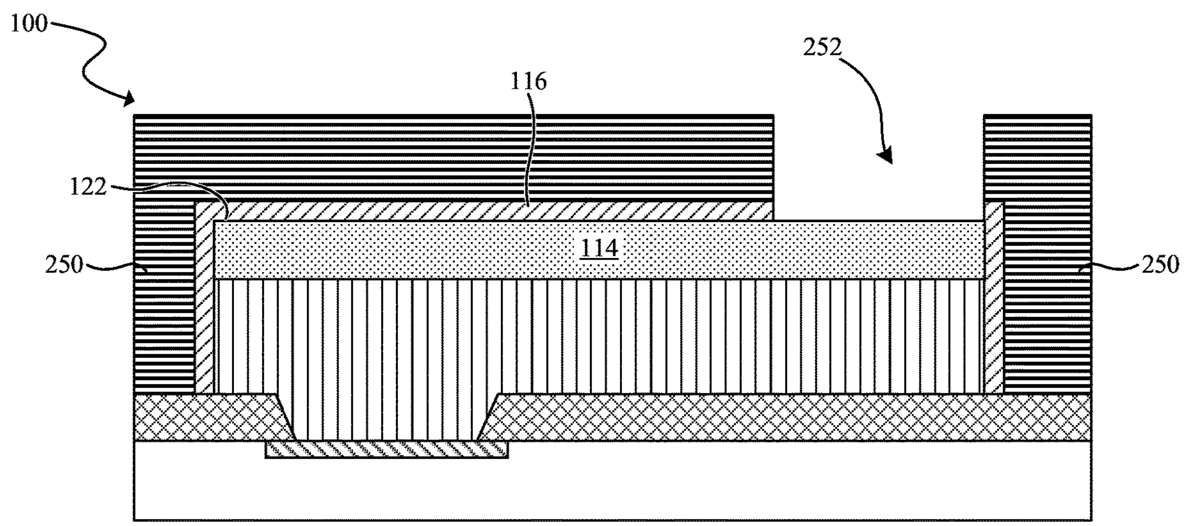

Referring to FIG. 2E, fabrication of the semiconductor die 100 continues by forming a second mask 250 (e.g., a photomask) at least on the containment layer 116 on the top surface 122 of the interconnect structure 110. The second mask 250 can be a resist material or other suitable mask material having an opening 252 at least partially aligned with a portion of the containment layer 116. In some embodiments, where the first mask 240 is not removed prior to forming the containment layer 116, the second mask 250 can be formed at least partially over the first mask 240. As further illustrated in FIG. 2E, the method continues by removing the portion of the containment layer 116 that is exposed in the opening 252 of the second mask 250. The portion of the containment layer 116 can be removed using, for example, a hydrogen chloride (HCl) clean process, a wet clean process, an etching process, or another process known in the art. As shown in FIG. 2E, after removing the portion of the containment layer 116, the second conductive material 114 is exposed in the opening 252 of the second mask 250. In other embodiments, instead of using a photomask, a portion of the containment layer 116 can be removed using a targeted laser or another suitable process to expose a portion of the second conductive material 114.

Figure 2F:
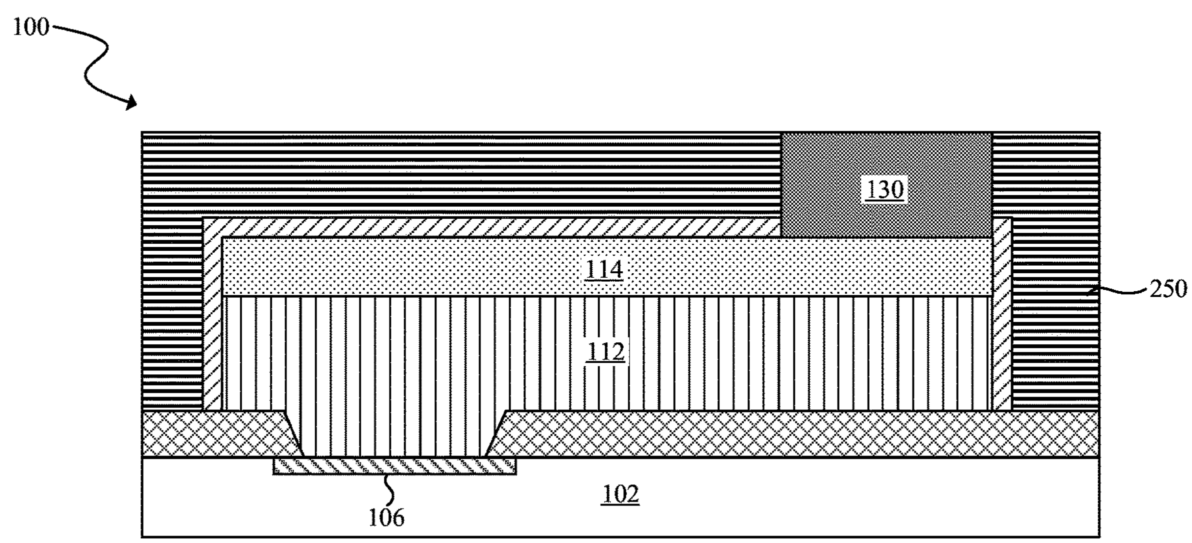

FIG. 2F illustrates the semiconductor die 100 after forming the electrical connector 130 in the opening 252 (FIG. 2E) of the second mask 250. For example, the electrical connector 130 can comprise a solder material (e.g., tin-silver, indium solder, etc.) that is plated into the opening 252 of the second mask 250 and onto the exposed portion of the second conductive material 114. The electrical connector 130 can also be formed by disposing a pre-formed solder ball in place on the second conductive material 114 or by using a suitable screen printing process, as is known in the art. Accordingly, the electrical connector 130 is electrically coupled to the contact 106—and the integrated circuitry of the substrate 102—via the conductive materials 112, 114. As shown in FIG. 2F, the electrical connector 130 can initially have a rectilinear (e.g., block-like) shape after it is formed in the opening 252.

Figure 2G:
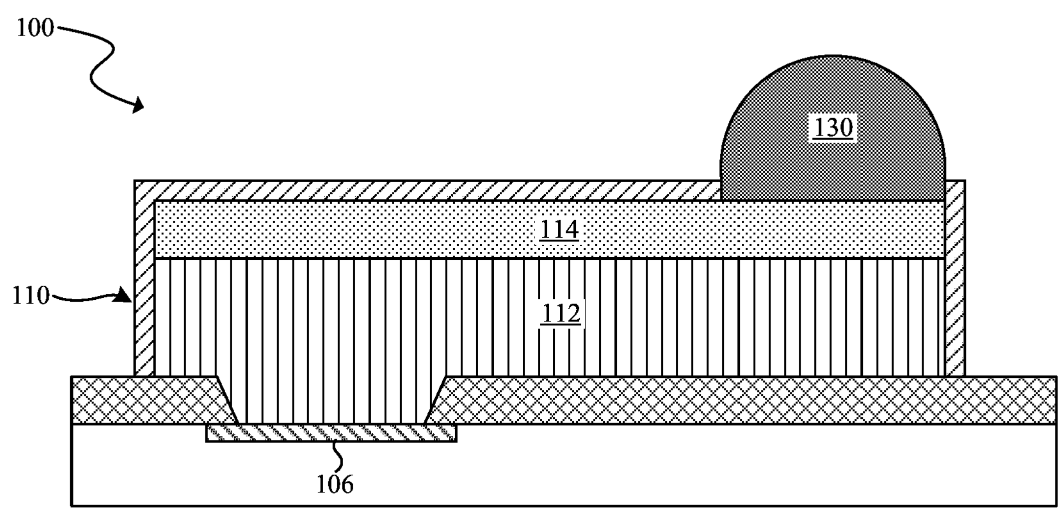

Referring to FIG. 2G, fabrication of the semiconductor die 100 continues by removing the second mask 250 (FIG. 2F) and reflowing the electrical connector 130 (e.g., to form a solder ball or solder bump), which gives the electrical connector 130 a more rounded shape. The second mask 250 can be removed in the same or a similar manner as the first mask 240 such as, for example, using a wet photoresist strip or other similar technique. The reflow process can be any suitable process known in the art for heating the electrical connector 130 to facilitate forming an electrical and/or mechanical connection between the interconnect 110 and an adjacent semiconductor die or other electrical component.

Figure 3A:
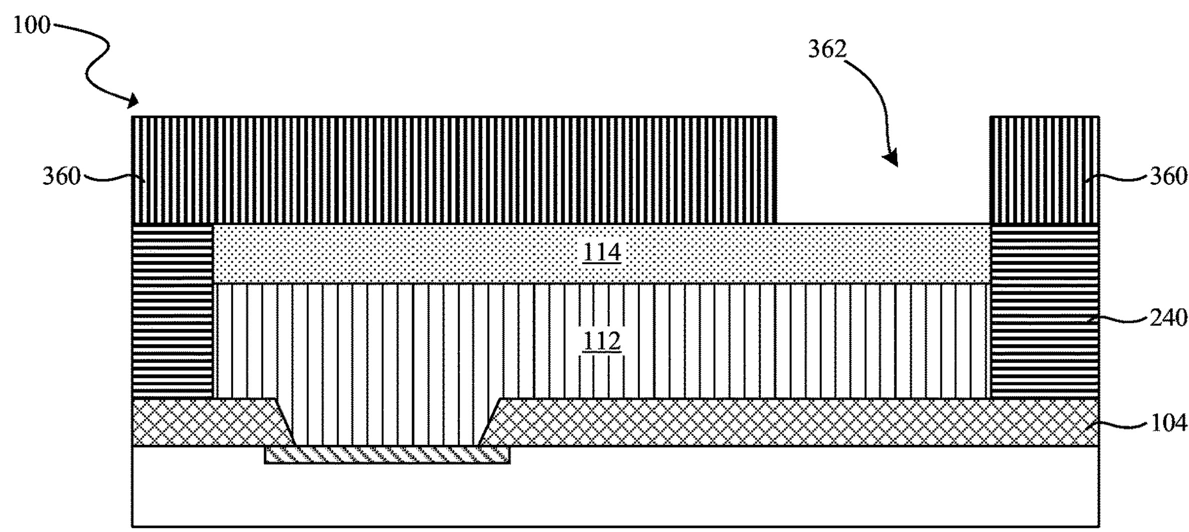
FIGS. 3A-3D are enlarged cross-sectional views illustrating a semiconductor die at various stages in a method for making interconnect structures in accordance with embodiments of the present technology.

FIGS. 3A-3D are enlarged cross-sectional views illustrating various stages in a method of manufacturing a semiconductor die 100 having interconnect structures 110 thereon, in accordance with another embodiment of the present technology. Many of the steps can be generally similar to those described above with reference to FIGS. 2A-2G. For example, FIG. 3A illustrates the semiconductor die 100 after the first mask 240 has been formed on the insulating material 104, and after plating the conductive materials 112, 114 into the opening of the first mask 240. However, as further illustrated in the embodiment of FIG. 3A, a second mask 360 (e.g., a photomask) is formed at least partially over the first mask 240 and the second conductive material 114. The second mask 360 can be a resist material or other suitable mask material having an opening 362 at least partially aligned with a portion of the second conductive material 114.

Figure 3B:
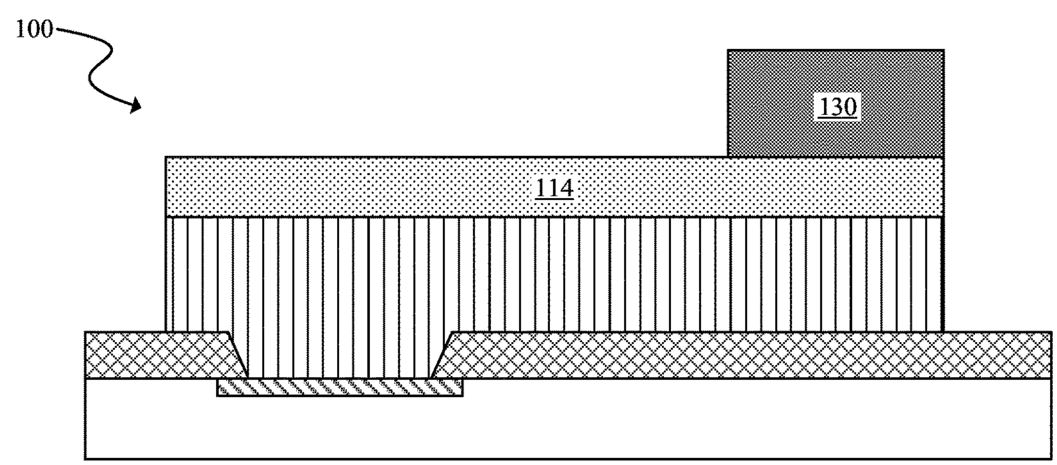

FIG. 3B illustrates the semiconductor die 100 after forming the electrical connector 130 in the opening 362 (FIG. 3A) of the second mask 360 and after removing the first and second masks 240 and 360. The electrical connector 130 can be a solder material (e.g., tin-silver) that is plated onto the portion of the second conductive material 114 that is exposed in the opening 362. The electrical connector 130 can also be formed by disposing a pre-formed solder ball in place on the second conductive material 114 or by using a suitable screen printing process, as is known in the art. The first and second masks 240 and 360 can be removed using a wet photoresist strip or other suitable technique known in the art. Notably, the electrical connector 130 is formed prior to the formation of a containment layer.

Figure 3C:
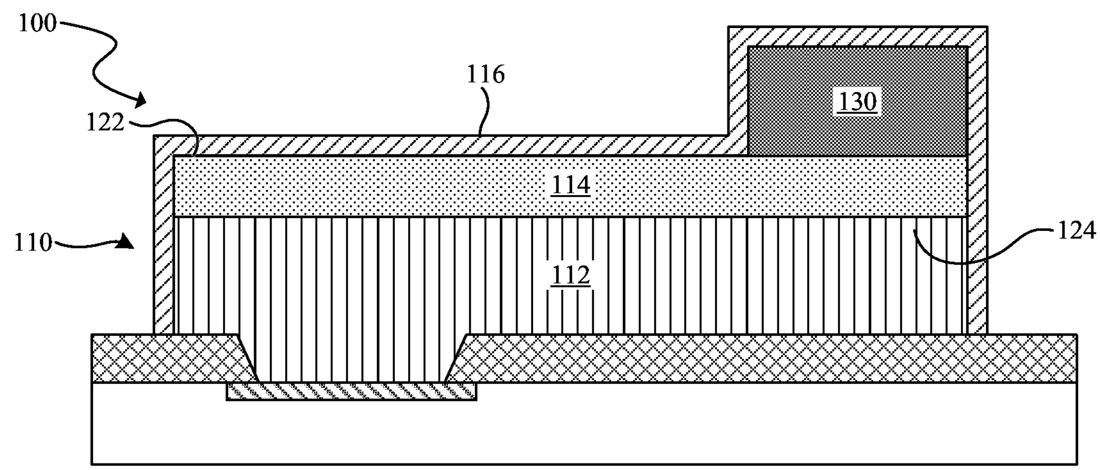

Referring to FIG. 3C, fabrication of semiconductor die 100 continues by forming the containment layer 116 over the exposed portions of the conductive materials 112, 114 and the electrical connector 130. That is, the containment layer 116 is formed as a blanket layer over the entire sidewall surface 124 of the interconnect structure 110, the exposed portion of the top surface 122 of the interconnect structure 110, and a top and sidewall surface of the electrical connector 130. In some embodiments, the containment layer 116 is formed by exposing the conductive materials 112, 114 and the electrical connector 130 to a plasma (e.g., using a plasma-enhanced chemical vapor deposition or other suitable process). In certain embodiments, only the second mask 360 (FIG. 3A) is removed after forming the electrical connector 130, and the first mask 240 is not removed prior to formation of the containment layer 116. In such embodiments, the containment layer 116 can be formed on only the exposed portion of the top surface 122 of the interconnect structure 110, and not the sidewall surface 124. In other embodiments, the containment layer 116 can be selectively formed on only a portion of the top surface 122 and/or sidewall surface 124.

Figure 3D:
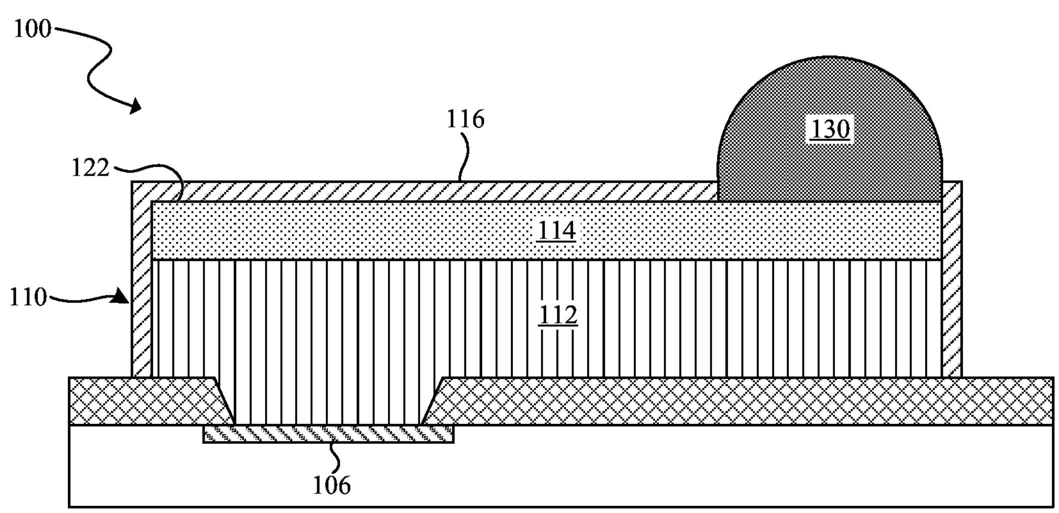

Referring to FIG. 3D, fabrication of the semiconductor die 100 continues by reflowing the electrical connector 130 to form, for example, a solder ball or solder bump on the top surface 122 of the interconnect structure 110 that is electrically coupled to the contact 106 through the conductive materials 112, 114. As illustrated in the embodiment of FIG. 3D, reflowing the electrical connector 130 can partially or fully remove the containment layer 116 from the surface of the electrical connector 130. For example, in some embodiments, the electrical connector 130 can comprise a solder material and a flux material. Heating the electrical connector 130 during the reflow process can activate the flux material to remove the containment layer 116 (e.g., an oxide) from the surface of the electrical connector 130. In other embodiments, a liquid flux can be introduced to the electrical connector 130 prior to or during the reflow process to facilitate removal of the containment layer 116 on the surface of the electrical connector 130. The reflow process can be any suitable process known in the art for heating the electrical connector 130 to facilitate forming an electrical and/or mechanical connection with an adjacent semiconductor die or another electrical component.

Notably, the interconnect structure 110 can be formed without adding significant additional costs or complexity to existing methods for forming interconnect structures. For example, as compared to many conventional methods for forming interconnect structures that are vertically aligned with the contacts of a semiconductor die, the methods described above with reference to FIGS. 2A-3D simply incorporate (i) a change in the mask pattern for plating conductive materials (e.g., such that the conductive materials 112, 114 extend laterally away from a corresponding contact 106 to form the elongated interconnect structure 110) and (ii) the additional step of forming a containment layer that prevents solder material from wicking along the elongated interconnect structure. In particular, it is expected that these modifications to existing processes for forming interconnects are less complex than other approaches to increasing the spacing between solder joints in a semiconductor device—such as forming a redistribution layer (RDL) on the semiconductor die or redesigning the semiconductor die itself.

Figure 4:
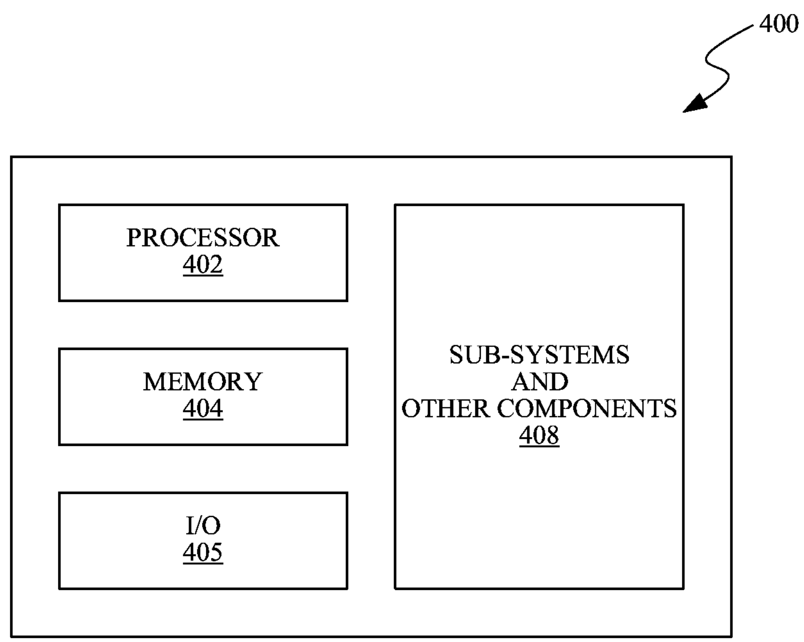
FIG. 4 is a schematic view of a system that includes a semiconductor die configured in accordance with embodiments of the present technology.

Any one of the semiconductor dies having the features described above with reference to FIGS. 1A-3D can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 405, and/or other subsystems or components 408. The semiconductor dies described above with reference to FIGS. 1A-3D can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. With regard to these and other example, the system 400 can be housed in a single unit or distributed over multiple interconnected units, e.g., through a communication network. The components of the system 400 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor die, comprising:

a substrate having a center portion and an outer edge portion;

an insulating material over a surface of the substrate;

an electrically conductive contact at the surface of the substrate;

an interconnect structure electrically coupled to the conductive contact, wherein the interconnect structure includes a top surface having a first portion and a second portion, wherein the first portion is vertically aligned with the conductive contact, and wherein the second portion extends (a) laterally away from the first portion in a direction away from the center portion and toward the outer edge portion of the substrate and (b) over at least a portion of the insulating material; and a solder material disposed at least partially on the second portion of the top surface.

2. The semiconductor die of claim 1, wherein the conductive contact is exposed at an opening in the insulating material.

3. The semiconductor die of claim 1, further comprising a containment layer over substantially all of the first portion of the top surface of the interconnect structure.

4. The semiconductor die of claim 1 wherein no portion of the solder material is vertically aligned with the electrically conductive contact.

5. The semiconductor die of claim 1 wherein less than about 50% of the solder material is vertically aligned with the electrically conductive contact.

6. The semiconductor die of claim 1 wherein less than about 25% of the solder material is vertically aligned with the electrically conductive contact.

7. The semiconductor die of claim 1 wherein the interconnect structure has an elongate rectangular shape.

8. The semiconductor die of claim 3 wherein the containment layer is configured to inhibit wicking of the solder material from the second portion to the first portion of the top surface.

9. The semiconductor die of claim 3 wherein the containment layer comprises nickel oxide.

10. The semiconductor die of claim 3 wherein the interconnect structure further includes a sidewall surface extending between the top surface and the substrate, and wherein the containment layer is at least partially over the sidewall surface.

11. A semiconductor die, comprising:
- a substrate;
- a first contact at a surface of the substrate;
- a second contact at the surface of the substrate, wherein the second contact is directly adjacent to the first contact;
- a first interconnect structure electrically coupled to the first contact, wherein the first interconnect structure includes a top surface having a first portion over the first contact and a second portion laterally offset from the first contact, wherein the top surface of the first interconnect structure extends laterally from the first portion to the second portion in a first direction;
- a first solder material disposed on the second portion of the top surface of the first interconnect structure;
- a second interconnect structure electrically coupled to the second contact, wherein the second interconnect structure includes a top surface having a third portion over the second contact and a fourth portion laterally offset from the second contact, wherein the top surface of the second interconnect structure extends laterally from the third portion to the fourth portion in a second direction opposite the first direction; and
- a second solder material disposed on the fourth portion of the top surface of the second interconnect structure.

12. The semiconductor die of claim 11 wherein the substrate includes a center portion and an outer edge portion, and wherein the first direction is a direction away from the center portion and toward the outer edge portion of the substrate.

13. The semiconductor die of claim 11 wherein the second contact is spaced apart from the first contact by a first distance, and wherein the second solder material is spaced apart from the first solder material by a second distance greater than the first distance.

14. The semiconductor die of claim 11 wherein the first interconnect structure includes a first containment layer over substantially all the first portion of the first interconnect structure, and wherein the second interconnect structure includes a second containment layer over substantially all the third portion of the second interconnect structure.

15. A method for inhibiting solder bridging, the method comprising:
- forming an interconnect structure on a surface of a substrate and at least partially over a conductive contact of the substrate;
- forming a containment layer on at least a first portion of a top surface of the interconnect structure; and
- disposing a solder material on a second portion of the top surface of the interconnect structure, wherein the second portion of the top surface of the interconnect structure is at least partially laterally offset from the conductive contact, and wherein the second portion of the top surface of the interconnect structure extends laterally away from the first portion of the top surface of the interconnect structure in a direction (a) away from a center portion of the substrate and (b) toward an outer perimeter of the substrate.

16. The method of claim 15 wherein disposing the solder material on the interconnect structure includes disposing the solder material before forming the containment layer on the interconnect structure.

17. The method of claim 15 wherein forming the containment layer includes forming the containment layer on the interconnect structure before disposing the solder material on the interconnect structure.

18. The method of claim 16 wherein forming the containment layer includes forming the containment layer over a surface of the solder material.

19. The method of claim 18, further comprising removing the containment layer from the surface of the solder material.

20. The method of claim 17 wherein the containment layer comprises a containment material, and wherein forming the containment layer includes:
- forming a layer of the containment material over all of the top surface of the interconnect structure; and
- removing a portion of the containment material on the second portion of the top surface of the interconnect structure.

* * * * *